(12) United States Patent
Ku et al.

(10) Patent No.: US 10,649,498 B2
(45) Date of Patent: May 12, 2020

(54) KICKSTANDS

(71) Applicant: HEWLETT-PACKARD DEVELOPMENT COMPANY, L.P., Houston, TX (US)

(72) Inventors: Chung-Hua Ku, Taipei (TW); Wei-Chung Chen, Taipei (TW); Wen-Hua Ni, Taipei (TW); Kuan-Ting Wu, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 34 days.

(21) Appl. No.: 15/746,123

(22) PCT Filed: Sep. 10, 2015

(86) PCT No.: PCT/US2015/049405
§ 371 (c)(1),
(2) Date: Jan. 19, 2018

(87) PCT Pub. No.: WO2017/044102
PCT Pub. Date: Mar. 16, 2017

(65) Prior Publication Data
US 2018/0217633 A1 Aug. 2, 2018

(51) Int. Cl.
*G06F 1/16* (2006.01)
*H05K 5/02* (2006.01)

(52) U.S. Cl.
CPC ............ *G06F 1/166* (2013.01); *G06F 1/1626* (2013.01); *G06F 1/1681* (2013.01); *H05K 5/0234* (2013.01)

(58) Field of Classification Search
CPC ..................................................... G06F 1/166
See application file for complete search history.

(56) References Cited

U.S. PATENT DOCUMENTS

| 5,646,818 A * | 7/1997 | Hahn | G06F 1/1616 |
|---|---|---|---|
| | | | 361/679.09 |
| 6,840,791 B2 * | 1/2005 | Hsiu | H01R 13/501 |
| | | | 320/107 |

(Continued)

FOREIGN PATENT DOCUMENTS

| CN | 204186786 U | 3/2015 |
|---|---|---|
| KR | 2010-0030039 A | 3/2010 |

(Continued)

OTHER PUBLICATIONS

Chief Chapree, "Hands-on with Microsoft Surface Pro 3: The Tablet that Aims to Replace Your Laptop"; Jun. 2014, pp. 1-12, lowyet.net.

(Continued)

*Primary Examiner* — Adrian S Wilson
(74) *Attorney, Agent, or Firm* — Staas & Halsey LLP (57) ABSTRACT

In one example, a kickstand for a mobile computing device is described. The kickstand having a first end and a second end opposite the first end to rotatably couple to a first side and a second side of a housing of the mobile computing device, respectively, proximate the middle of the first side and the second side of the housing such that the U shaped kickstand provides the space for disposing the components in the housing without significantly affecting form factors and/or aesthetic aspects of the mobile computing device in typing, inking and retracted modes.

11 Claims, 7 Drawing Sheets

(56) References Cited

U.S. PATENT DOCUMENTS

| | | | | |
|---|---|---|---|---|
| 7,540,466 B2* | 6/2009 | Yang | ............ | F16M 11/10 248/126 |
| 9,013,865 B2* | 4/2015 | Chen | ............ | H05K 5/0217 361/679.21 |
| 9,501,108 B2* | 11/2016 | Lee | ............ | G06F 1/1601 |
| 2002/0149905 A1* | 10/2002 | Jackson, Jr. | ............ | G06F 1/16 361/679.21 |
| 2003/0024765 A1* | 2/2003 | Sugiura | ............ | G06F 1/1613 181/199 |
| 2004/0155859 A1* | 8/2004 | Lee | ............ | F16M 11/105 345/156 |
| 2004/0201871 A1* | 10/2004 | Risheq | ............ | G06F 1/1618 358/474 |
| 2005/0052831 A1* | 3/2005 | Chen | ............ | G06F 1/1616 361/679.11 |
| 2005/0257341 A1* | 11/2005 | Chen | ............ | F16M 11/10 16/17.1 |
| 2006/0028791 A1* | 2/2006 | Huang | ............ | G06F 1/1601 361/679.08 |
| 2006/0034045 A1* | 2/2006 | Wang | ............ | G06F 1/1616 361/679.55 |
| 2006/0104020 A1* | 5/2006 | Fan | ............ | G06F 1/1613 361/679.55 |
| 2006/0287017 A1* | 12/2006 | Wu | ............ | H04M 1/0202 455/575.7 |
| 2007/0012856 A1* | 1/2007 | Chan | ............ | F16M 11/10 248/677 |
| 2007/0159778 A1* | 7/2007 | Lin | ............ | G06F 1/1626 361/679.22 |
| 2007/0217135 A1* | 9/2007 | Chuang | ............ | G06F 1/1626 361/679.05 |
| 2008/0062624 A1* | 3/2008 | Regen | ............ | G06F 1/1616 361/679.3 |
| 2008/0253066 A1* | 10/2008 | Tracy | ............ | F16M 11/10 361/601 |
| 2008/0274774 A1* | 11/2008 | Kim | ............ | G06F 1/1626 455/575.1 |
| 2009/0001232 A1* | 1/2009 | Seo | ............ | G06F 1/1616 248/176.1 |
| 2009/0201254 A1* | 8/2009 | Rais | ............ | G06F 1/1613 345/168 |
| 2009/0261216 A1* | 10/2009 | Yang | ............ | H04M 1/04 248/168 |
| 2009/0262079 A1* | 10/2009 | Bury | ............ | G06F 1/162 345/169 |
| 2009/0321609 A1* | 12/2009 | Wang | ............ | G06F 1/1626 248/685 |
| 2010/0014230 A1* | 1/2010 | Horie | ............ | G06F 1/16 361/679.01 |
| 2010/0259876 A1 | 10/2010 | Kim | | |
| 2010/0276553 A1* | 11/2010 | Li | ............ | G06F 1/166 248/121 |
| 2011/0279993 A1* | 11/2011 | Su | ............ | F16M 11/10 361/807 |
| 2011/0286171 A1 | 11/2011 | Franz et al. | | |
| 2012/0044624 A1* | 2/2012 | Hoffman | ............ | G06F 1/1628 361/679.21 |
| 2012/0050966 A1* | 3/2012 | Liu | ............ | G06F 1/1616 361/679.01 |
| 2012/0074284 A1* | 3/2012 | Huang | ............ | F16M 11/10 248/274.1 |
| 2012/0106043 A1* | 5/2012 | Murakata | ............ | G06F 1/1626 361/679.01 |
| 2012/0162102 A1* | 6/2012 | Cheng | ............ | F16M 11/041 345/173 |
| 2012/0168590 A1* | 7/2012 | Yang | ............ | F16M 11/10 248/346.3 |
| 2012/0257351 A1* | 10/2012 | Wang | ............ | G06F 1/166 361/679.58 |
| 2012/0262854 A1* | 10/2012 | Robert | ............ | G06F 1/1613 361/679.01 |
| 2013/0094131 A1 | 4/2013 | O'Donnell et al. | | |
| 2013/0335891 A1 | 12/2013 | Chen et al. | | |
| 2014/0085777 A1 | 3/2014 | Yeh et al. | | |
| 2014/0293534 A1 | 10/2014 | Siddiqui | | |
| 2016/0216742 A1* | 7/2016 | Lee | ............ | F16M 11/38 |

FOREIGN PATENT DOCUMENTS

| | | |
|---|---|---|
| KR | 10/2010-0049035 A | 5/2010 |
| WO | WO-2014/142868 A1 | 9/2014 |

OTHER PUBLICATIONS

Dana Wollman, "Lenovo's 'Yoga' Android Tablet has a Built-In Kickstand Containing an 18-hour Battery (Hands-On)," Oct. 29, 2013, pp. 1-7, engadget.com.

Joel Santo Domingo, "Sony Vaio Tap 20 Review," Oct. 17, 2012, pp. 1-7, ITProPortal.

* cited by examiner

KICKSTANDS

BACKGROUND

Mobile computing devices have been developed to increase the functionality that is made available to users in a mobile setting. For example, a user may interact with tablet computer, such as a 2-in-1 tablet, or other such mobile computing devices to check email, surf the web, compose texts, interact with applications and so on.

Because mobile computing devices are designed to be used in a handheld manner. Typical ways of adapting mobile computing devices for other uses, such as a tablet on a table or other surface, include some way of supporting with the display of the mobile computing device on the surface in order to prop up or orient the display relative thereto in typing and inking modes. Generally, such supporting of the mobile computing device tends to be awkward and inadequate in providing a stable support during the typing and inking modes and may also result in compromising desired form factors, such as size, battery life and the like.

BRIEF DESCRIPTION OF THE DRAWINGS

Examples are described in the following detailed description and in reference to the drawings, in which.

DETAILED DESCRIPTION

The present specification describes a U shaped kickstand for a 2-in-1 tablet. The present specification further describes a U shaped kickstand including a hinge mechanism for a 2-in-1 tablet.

Furthermore, the present specification describes the U shaped kickstand including the hinge mechanism that provides a stable typing and inking angle positions to users of a tablet, such as 2-in-1 tablet. Furthermore, the configurations of the U shaped kickstand including the hinge mechanism do not significantly affect the desired form factors, such as thickness and battery size/life. Also, the U shaped kickstand provides a stable/rigid support in both typing and inking modes without compromising the above form factors. Also, the hinge mechanism is designed to be easily assembled/replaced by an original equipment manufacturer (OEM) or by a customer, which may result in lower assembly costs and facilitating improved parts management at OEM. Furthermore, even an end user may easily replace an old U shaped kickstand with a new one without removing the enclosure.

Moreover, openings to mount the U shaped kickstand including the hinge mechanism are designed to not significantly affect the 2-in-1 tablet's structural rigidity. In addition, the present specification describes a unibody housing design that integrates with the hinge mechanism without affecting the rigidity or the form factors of the 2-in-1 tablet. Further, the design configuration of the U shaped kickstand including the hinge mechanism minimizes 2-in-1 tablet thickness, maximizes rigidity and internal spaces for battery and other such components.

In the following description, for purposes of explanation, numerous specific details are set forth in order to provide a thorough understanding of the present techniques. It will be apparent, however, to one skilled in the art that the present apparatus, devices and systems may be practiced without these specific details. Reference in the specification to "an example" or similar language means that a particular feature, structure, or characteristic described is included in at least that one example, but not necessarily in other examples. The term 'tablet' refers to "tablet personal computer".

Figure 1:
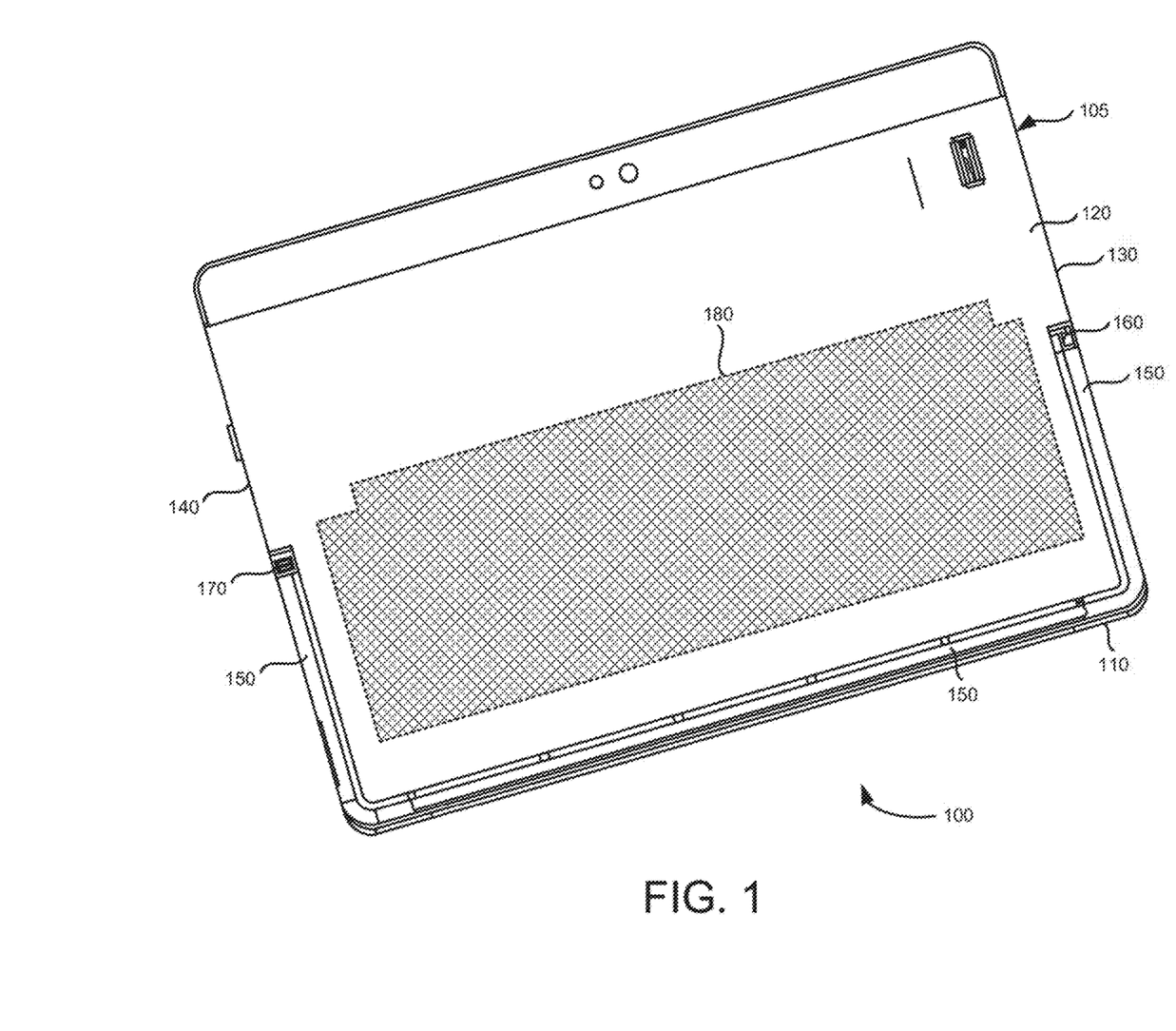
FIG. 1 depicts an example perspective view of a mobile computing device, such as a 2-in-1 tablet, with a wide U shaped kickstand deployed in accordance with techniques of the present application.

Turning now to the figures, FIG. 1 depicts a perspective view of an example housing 105 including a U shaped kickstand 150 that does not significantly affect the form factor of battery used in a mobile computing device 100 in accordance with techniques of the present application. Example mobile computing devices are 2-in-1 tablets, tablets, personal digital assistants (PDAs), ultra-mobile personal computers, smart phones and the like.

FIG. 1 shows a top side 110 and a bottom side 120 of the housing 105 of the mobile computing device 100. Also shown in FIG. 1, are a first side 130 and a second side 140 of the housing 105 of the mobile computing device 100. Further shown in FIG. 1 is the U shaped kickstand 150 having a first end 160 and a second end 170. Furthermore as shown in FIG. 1, the first end 160 and the second end 170 of the U shaped kickstand 150 are rotatably coupled approximately to the middle of the first side 130 and the second side 140 of the mobile computing device 100, respectively. Furthermore, rotatably disposing the U shaped kickstand 150 to the housing 105 may facilitate in requiring less arm force to move the U shaped kickstand 150 to place the mobile computing device 100 in the inking, typing and retracted modes. For example, using other shapes for the kickstand, such as a rectangular shaped kickstand positioning in the middle or lower part of the housing 105 may not result in providing the space to dispose components and may not also yield desired form factors.

It can be seen in FIG. 1 that the U shaped kickstand 150 when not in use and in the retracted mode, i.e., retracted inwardly towards the bottom side 120, conforms to the shape of the mobile computing device 100 without significantly affecting the size form factors of the mobile computing device 100. For example, the U shaped kickstand may be shaped and mounted to the housing 105 such that the U shaped kickstand in typing, inking and retracted modes provides the space to dispose the components in the housing 105 without significantly affecting the size form factors of the mobile computing device 100.

In addition it can be seen in FIG. 1, that the U shaped kickstand 150 in the retracted position does not affect battery 180 form factors as well. One skilled in the art may envision that even when the U shaped kickstand 150 is swung outwardly from the bottom side 120, does not significantly affect desired form factors of the mobile computing device 100. Other example form factors are thickness of the mobile computing device 100, size/life of components used in the mobile computing device 100, such as, battery, main board, storage device, memory card, and display panel printed circuit board.

Figure 2A:
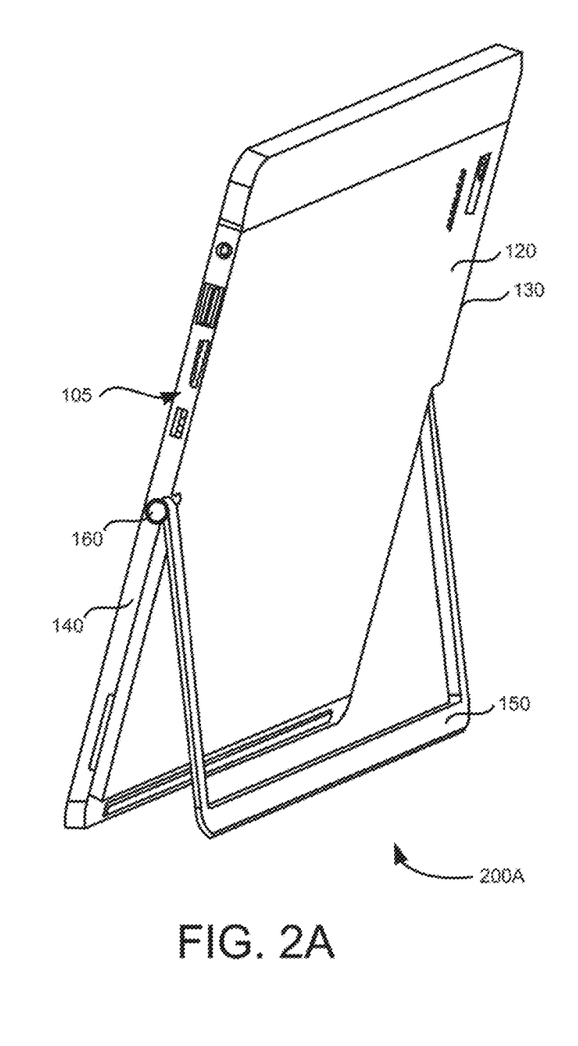
FIGS. 2A and 2B depict example perspective views of the mobile computing device with the wide U shaped kickstand of FIG. 1 in typing and inking modes in accordance with techniques of the present application.
Figure 2B:
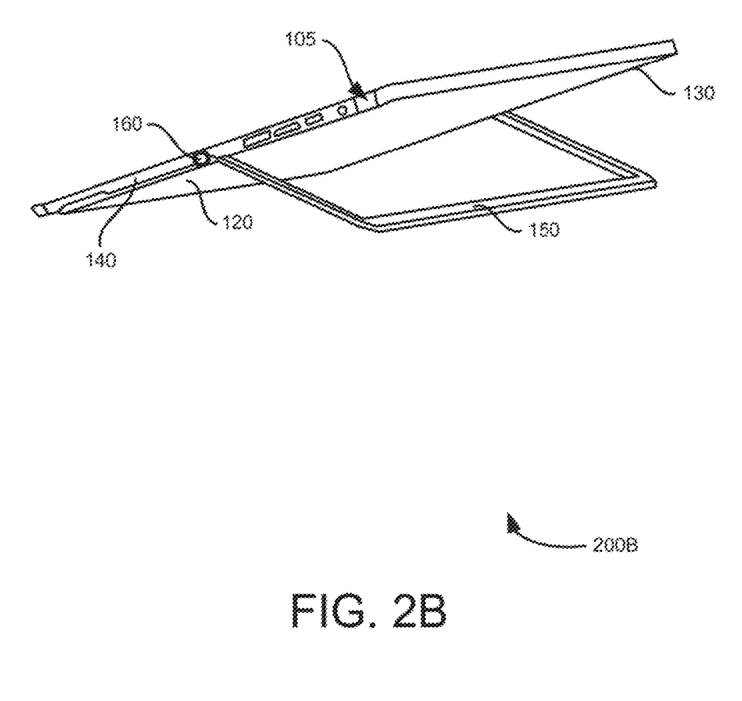

FIGS. 2A and 2B depict example perspective views 200A and 200B of the mobile computing device 100, such as a 2-in-1 tablet, with the wide U shaped kickstand 150 of FIG. 1 disposed in typing and inking modes, respectively, in accordance with techniques of the present application. Further it can be seen in FIGS. 2A and 2B, that the U shaped kickstand 150 when retracted outwardly from the bottom side 120 of the mobile computing device 100 provides support to the mobile computing device 100 in both the typing and inking modes. In typing mode the U shaped kickstand 150 may be positioned such that the screen of the mobile computing device 100 may be disposed rigidly in a suitable viewing angle to the user. In this position a user may type via the screen monitor and in this position the U shaped kickstand 150 provides the rigid support to facilitate typing on the screen. Similarly in the inking mode the user may utilize a pen to write/draw on the screen and the U shaped kickstand 150 may be positioned such that the screen is substantially horizontal and stable to withstand user's hand resting force while facilitating writing on the screen.

Figure 3:
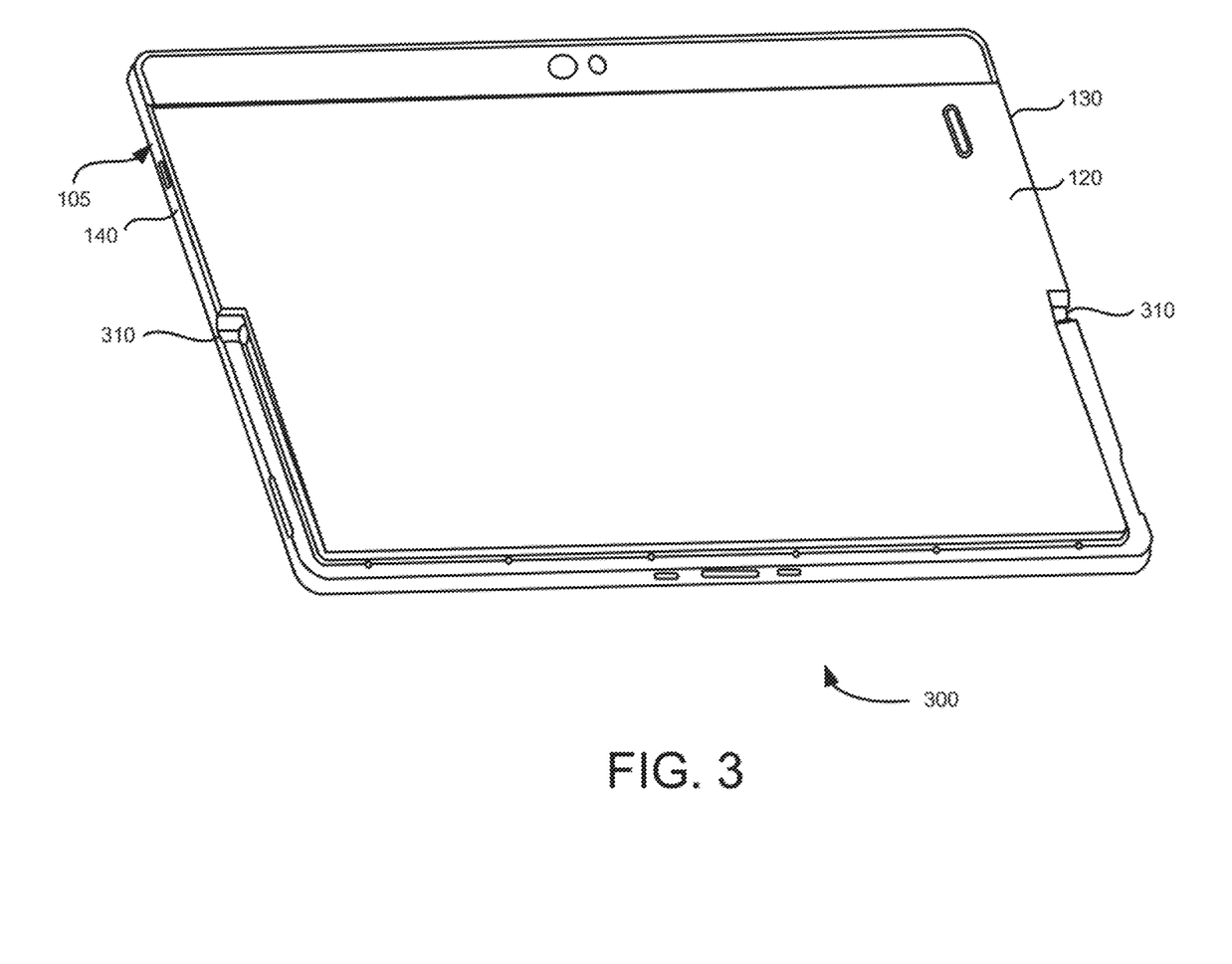
FIG. 3 depicts an example perspective view illustrating two openings to secure the U shaped kickstand to the housing of the mobile computing device shown without the U shaped kickstand, in accordance with techniques of the present application.

FIG. 3 depicts an example perspective view 300 of the backside 120 of the mobile computing device 100 illustrating two openings 310 to hold and secure the U shaped kickstand 150 to the housing 105 of the mobile computing device 100, such as the 2-in-1 tablet shown without the U shaped kickstand 150 for clarity, in accordance with techniques of the present application.

Figure 4A:
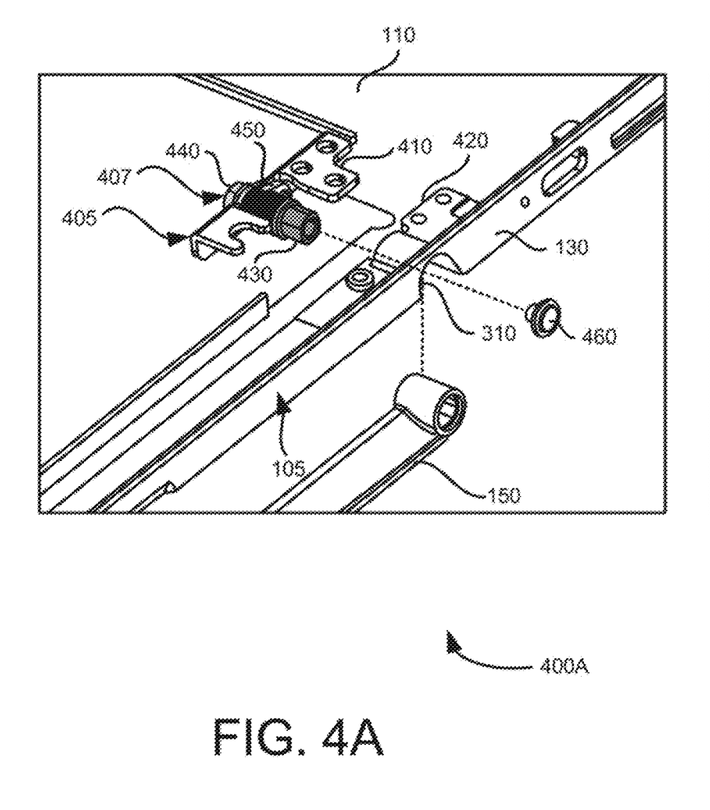
FIGS. 4A and 4B depict example exploded views of major components of a hinge mechanism used to secure the U shaped kickstand to the housing of the mobile computing device of FIG. 1, in accordance with techniques of the present application.
Figure 4B:
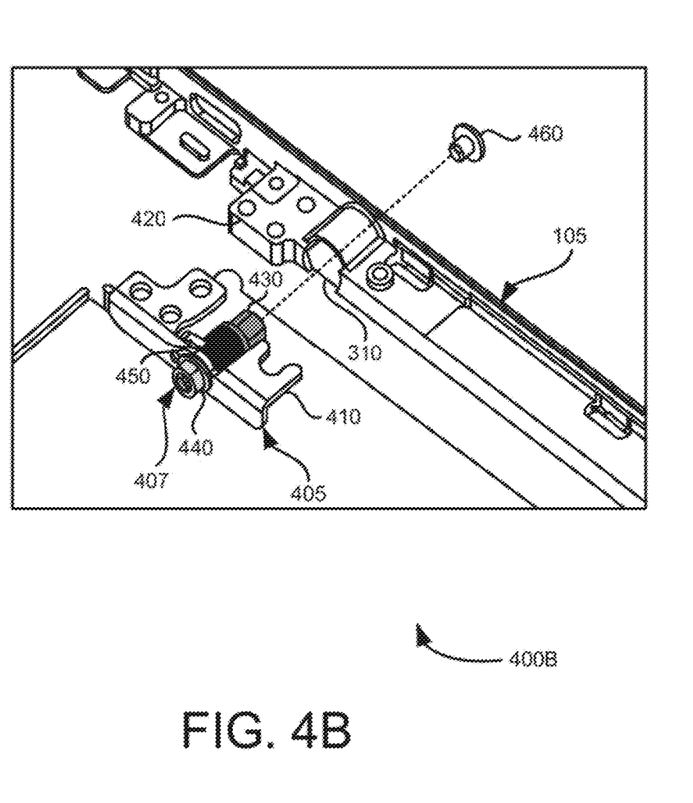

FIGS. 4A and 4B illustrate exploded views 400A and 400B, respectively, including the openings 310 in the housing 105 of the mobile computing device 100. The openings 310 are designed such that they do not significantly compromise/affect the structural rigidity of the housing 105 of the mobile computing device 100. For example, this may be accomplished by using a smaller size opening 305 in the housing 105 designed to receive a hinge mechanism 405 (shown in FIGS. 4A and 4B) including a shaft assembly 407 (shown in FIGS. 4A and 4B). The smaller sized opening assists in maintaining the structural rigidity of the housing 105.

Figure 5:
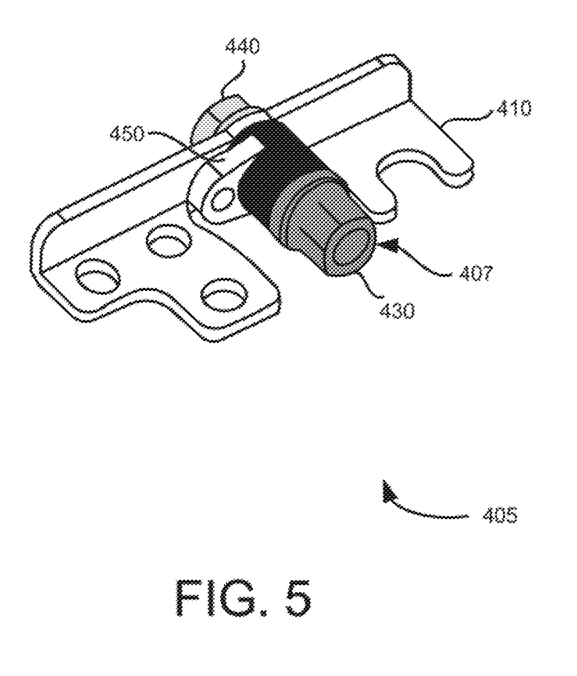
FIG. 5 depicts an example perspective view of the hinge mechanism with a single plate and a customized shaft of the hinge mechanism used to join the U shaped kickstand of FIG. 1, in accordance with techniques of the present application.

Further FIGS. 4A and 4B along with FIG. 5 show perspective views of a hinge mechanism 405 used in securing the U shaped kickstand 150 to the housing 105 and to further provide stable support to the mobile computing device 100 in both the typing and inking modes 200A and 200B shown in FIGS. 2A and 2B, respectively. For example, the hinge mechanism 405 connects to the U shaped kickstand 150 and provides torque to allow stable support in any desired viewing angle.

Furthermore, FIGS. 4A and 4B show the hinge mechanism 405 including a support plate 410 that is designed to rigidly attach to each of the first side 130 and the second side 140 around area 420 of the housing 105. In addition, FIGS. 4A and 4B along with FIG. 5 show the hinge mechanism 405 including a shaft assembly 407 that is designed to be rigidly held in each support plate 410 and further designed to rotatably receive and provide a spring force to the first end 160 and the second end 170 of the U shaped kickstand 150. Moreover, FIGS. 4A and 4B show the hinge mechanism 405 including a fastener 440 and a screw 460 that is designed to rotatably hold in place each of the first end 160 and the second end 170 (shown in FIG. 1) of the U-shaped kickstand 150, in the shaft assembly 407. FIG. 5 illustrates an example hinge mechanism 405 including a shaft assembly 407. As shown in FIG. 5, the shaft assembly 407 includes a cam 450 and a spring washer/customized shaft 430 designed to provide a spring force to the first end 160 and the second end 170 of the U shaped kickstand 150 to achieve stable support to the mobile computing device 100 in the typing and inking modes shown in FIGS. 2A and 2B. For example, a user can position the U shaped kickstand 150 at back of the mobile computing device 100 to support and keep the screen of the mobile computing device 100 at an appropriate viewing angle to the user during typing and/or inking modes, as shown in FIGS. 2A and 2B, by positioning. Further in such a standing position, the U shaped kickstand 150 may experience high pressing forces based on the inking behavior of the user. Also, the U shape kickstand 150 is capable of locating a pivot around middle of the mobile computing device 100 and may not occupy much of the mobile computing device 100 in the center area where the battery and/or any other system components may be disposed. Such configuration may lend itself to a lesser application of force/torque on the U shaped kickstand 150, which in turn may result in providing a more stable/rigid support to the mobile computing device 100 by the U shaped kickstand 150 when using in typing or inking modes when compared with kickstands that may place a pivot at the bottom or top edge of the mobile computing device 100 in order to provide space in the mobile computing device 100 for components, such as battery 180. For example, a cam type hinge along with specific shaft assembly 407 geometry (as shown in FIG. 5) may be utilized to mount the U shaped kickstand 150 to the housing 105 to provide the stable/rigid support to the mobile computing device 100.

Furthermore as shown in FIGS. 2A and 2B, the first end 160 and the second end 170 of the U shaped kickstand 150 are designed to rotatably dispose in the shaft assembly 407 (shown in FIGS. 4A and 4B) of the hinge mechanism 405. In addition as shown in FIGS. 2A and 2B, the U shaped kickstand 150 is further designed to rotatably swing outwardly from the bottom side 120 opposite the top side 110 of the housing 105 and to engage and provide stable support in both typing and display modes of the mobile computing device 100. Also as shown in FIG. 1, the U shaped kickstand 150 is further designed to retract inwardly towards the bottom side of the housing 105 without significantly affecting desired form factors and/or the aesthetic aspects of the mobile computing device 100. In this example, the U shaped kickstand 150 along with the housing 105 are integrated such that the U shaped kick stand 150 conforms to the shape of the mobile computing device 100 without substantially extending beyond the outer surfaces of the mobile computing device 100.

Figure 6A:
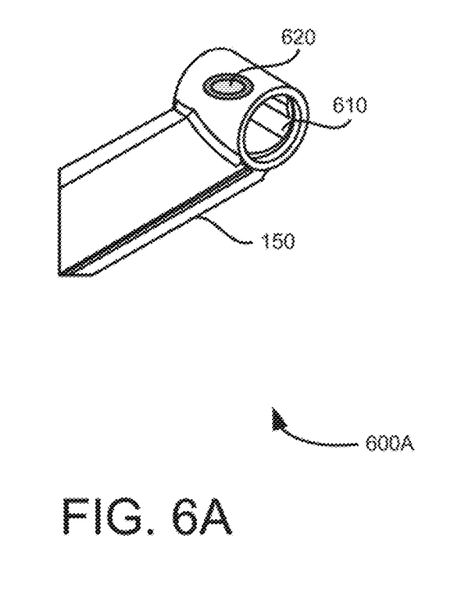
FIGS. 6A and 6B depict an example perspective view and an elevation view, respectively, illustrating a screw type and a geometric feature, respectively used in the U shaped kickstand to securely fit to the customized shaft, shown in FIG. 5, in accordance with techniques of the present application.
Figure 6B:
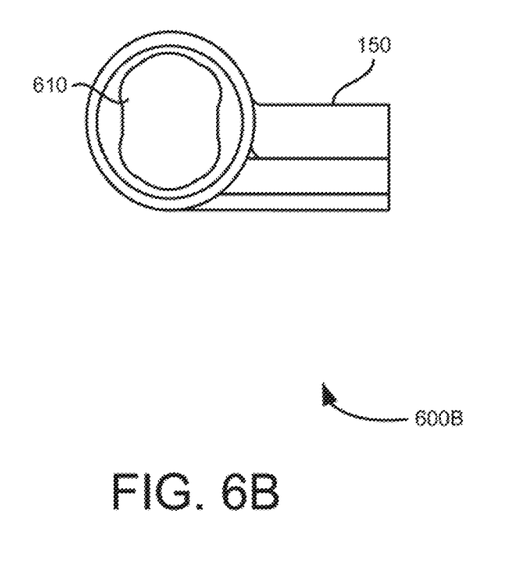
Figure 7:
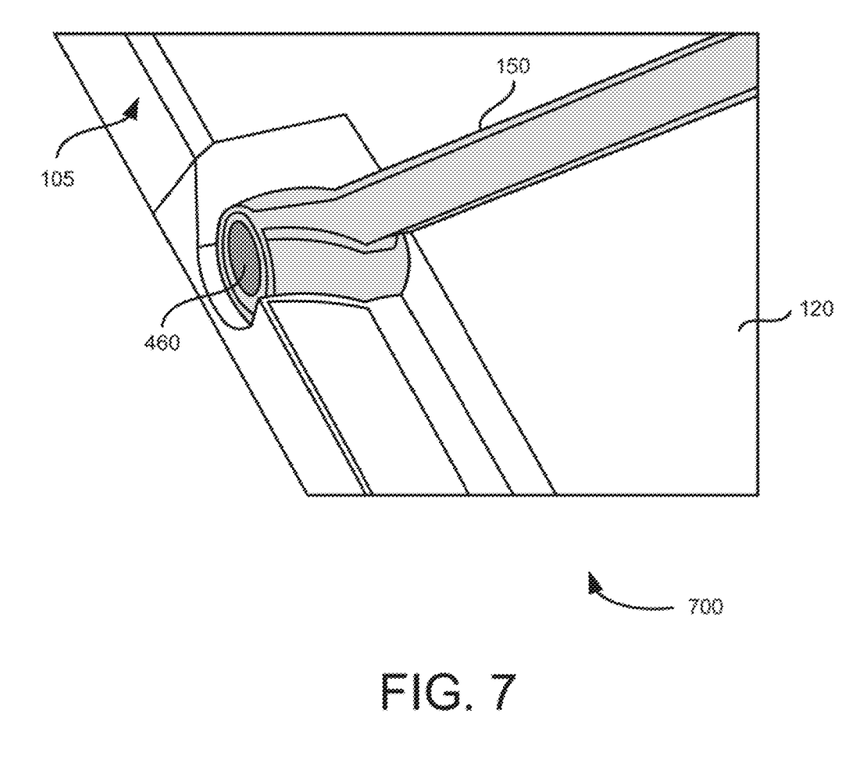
FIG. 7 depicts an example perspective view illustrating how the hinge mechanism of FIGS. 4A and 4B is designed to not to collect foreign material that can jam the hinge mechanism.

FIGS. 6A and 6B depict an example perspective view and elevation view 600A and 600B, respectively, showing a screw type 620 and a geometric feature of the opening 610, respectively, used in the U shaped kickstand 150 to securely fit to the customized shaft 430 (shown in FIG. 5), in accordance with techniques of the present application. Further. FIG. 7 shows an example perspective view 700 illustrating how the hinge mechanism 405 (shown in FIGS. 4A and 4B) is designed not to collect any foreign material that can jam the hinge mechanism 405. For example, the U shaped kickstand 150 may be designed as a barrel type mounting hole 610 to the hinge mechanism 405. It can be seen in FIG. 7 that the barrel type shape encapsulates the hinge mechanism 405 such that it prevents any foreign material from entering the hinge mechanism 405 to prevent jamming the hinge mechanism 405.

In this manner, the present application discloses the U shaped kickstand design that does not affect form factors for a 2-in-1 tablet.

The foregoing describes novel U shaped kickstand including the hinge mechanism for mobile electronic devices, such as 2-in-1 tablets. While the above application has been shown and described with reference to the foregoing examples, it should be understood that other forms, details, and implementations may be made without departing from the spirit and scope of this application.

What is claimed is:

1. A kickstand, comprising:
   a U shaped kickstand having a first end and a second end opposite the first end to rotatably couple to a first side and a second side of a housing of a mobile computing device through a barrel shaped mounting hole, respectively, the barrel shaped mounting hole being located at a middle location equidistant from a bottom end and a top end of the first side and equidistant from a bottom end and a top end of the second side of the housing,
   wherein first end and the second each include a hinge mechanism to rotatably couple to the first side and the second side of the housing, respectively,
   wherein the hinge mechanism comprises:
      a support plate that is to rigidly attach to each of the first side and the second side of the housing, respectively;
      a shaft assembly including a cam and a spring washer, the shaft assembly to be rigidly held in each support plate and further to rotatably receive and provide a spring force to the first end and the second end of the U shaped kickstand; and
      a fastener to rotatably hold in place each of the first end and the second end of the U-shaped kickstand, in the shaft assembly.

2. The kickstand of claim 1, wherein the mobile computing device is a tablet, a personal digital assistant (PDA), a ultra-mobile personal computer or a smart phone.

3. The kickstand of claim 1, wherein the U shaped kickstand is further to rotatably swing outwardly from a bottom side opposite a top side of the housing and to provide a stable support in both typing and display modes of the mobile computing device, and furthermore the U shaped kickstand is to retract inwardly towards the bottom side of the housing without significantly affecting form factors and/or aesthetic aspects of the mobile computing device.

4. The kickstand of claim 1, wherein the form factors are thickness of the mobile computing device and size/life of components selected from the group consisting of battery, main board, storage device, memory card, and display panel printed circuit board.

5. A mobile computing device, comprising:
   a housing having a top side and a bottom side opposite the top side and further having a first side and a second side opposite the first side;
   a hinge mechanism; and
   a U shaped kickstand having a first end and a second end opposite the first end being rotatably coupled through a barrel shaped mounting hole, relative to the first side and the second side of the housing via the hinge mechanism, the barrel shaped mounting hole being located at a middle location equidistant from a bottom end and a top end of the first side and equidistant from a bottom end and a top end of the second side of the housing,
   wherein first end and the second each include the hinge mechanism to rotatably couple to the first side and the second side of the housing, respectively,
   wherein the hinge mechanism comprises:
      a support plate that is to rigidly attach to each of the first side and the second side of the housing, respectively;
      a shaft assembly including a cam and a spring washer, the shaft assembly to be rigidly held in each support plate and further to rotatably receive and provide a spring force to the first end and the second end of the U shaped kickstand; and
      a fastener to rotatably hold in place each of the first end and the second end of the U-shaped kickstand, in the shaft assembly.

6. The mobile computing device of claim 5, wherein the mobile computing device is a tablet, a personal digital assistant (PDA), a ultra-mobile personal computer or a smart phone.

7. The mobile computing device of claim 5, wherein the first end and the second end of the U shaped kickstand are to rotatably dispose in the f-shaft assembly of each hinge mechanism, and further to rotatably swing outwardly from a bottom side opposite a top side of the housing and to engage and provide a stable support in both typing and display modes of the mobile computing device, and furthermore the U shaped kickstand is to retract inwardly towards the bottom side of the housing without significantly affecting form factors and/or the aesthetic aspects of the mobile computing device.

8. The mobile computing device of claim 5, wherein the form factors are thickness of the mobile computing device and size/life of components selected from the group consisting of battery, main board, storage device, memory card, and display panel printed circuit board.

9. A tablet, comprising:
   a housing having a top side and a bottom side opposite the top side and further having a first side and a second side opposite the first side;
   a U shaped kickstand having a first end and a second end opposite the first end being rotatably coupled to the first side and the second side of the housing, respectively through a barrel shaped mounting hole, the barrel shaped mounting hole being located at a middle location equidistant from a bottom end and a top end of the first side and equidistant from a bottom end and a top end of the second side of the housing,
   wherein first end and the second each include a hinge mechanism to rotatably couple to the first side and the second side of the housing, respectively,
   wherein the hinge mechanism comprises:
      a support plate that is to rigidly attach to each of the first side and the second side of the housing, respectively;
      a shaft assembly including a cam and a spring washer, the shaft assembly to be rigidly held in each support plate and further to rotatably receive and provide a spring force to the first end and the second end of the U shaped kickstand; and a fastener to rotatably hold in place each of the first end and the second end of the U-shaped kickstand, in the shaft assembly.

10. The tablet of claim 9, wherein the first end and the second end of the U shaped kickstand are to rotatably dispose in a shaft assembly, and further to rotatably swing outwardly from a bottom side opposite a top side of the housing and to provide a stable support in both typing and display modes of the 2-in-1 tablet and furthermore the U shaped kickstand is to retract towards the bottom side of the housing without significantly affecting form factors and/or aesthetic aspects of the 2-in-1 tablet.

11. The tablet of claim 9, wherein the form factors are thickness of the 2-in-1 tablet and size/life of components selected from the group consisting of battery, main board, storage device, memory card, and display panel printed circuit board.

* * * * *